Sept. 6, 1966 D. C. STOUFFER 3,270,570

DRIVE SYSTEM

Filed Sept. 9, 1963 2 Sheets-Sheet 1

INVENTOR.
DONALD C. STOUFFER
BY [signature]
ATTORNEY

Sept. 6, 1966 D. C. STOUFFER 3,270,570

DRIVE SYSTEM

Filed Sept. 9, 1963 2 Sheets-Sheet 2

INVENTOR.
DONALD C. STOUFFER
BY Stanley H. Zeyhen [signature]
ATTORNEY

United States Patent Office 3,270,570

Patented Sept. 6, 1966

3,270,570

DRIVE SYSTEM

Donald C. Stouffer, Philadelphia, Pa., assignor to Philco Corporation, Philadelphia, Pa., a corporation of Delaware Filed Sept. 9, 1963, Ser. No. 307,476
14 Claims. (Cl. 74—10.5)

The present invention relates to drive systems and more particularly to manually operable drive means for effecting the tuning of a television receiver.

It is now required that television receivers be adapted to receive all channels in the UHF (ultra high frequency) band assigned to commercial transmitting stations, as well as the previously assigned twelve channels in the VHF (very high frequency) band. In complying with this requirement it is generally desirable to equip the receiver with two separate tuners, one serving to effect the selection of VHF signals and the other serving to effect the selection of UHF signals. Also it is preferable, for economical as well as operational reasons, that the VHF tuner be of the type in which a switching rotor is actuatable step-by-step to obtain coarse tuning and in which presettable fine tuning mechanism is actuatable to obtain accurate tuning adjustments, and that the UHF tuner be of the continuously variable condenser type in which rotor means is actuatable at accelerated rotational speed to obtain coarse tuning and at reduced rotational speed to obtain accurate tuning.

However, the association of such tuners gives rise to difficulties and problems particularly with respect to the provision of means for driving the respective tuners in a manner which affords coarse as well as fine tuning throughout the tuning ranges in either clockwise or counterclockwise directions for both VHF and UHF bands. These difficulties and problems are enhanced by the fact that the tuner drive means should be associated for manual operation at one location on the receiver cabinet and should be such that preset fine tuning of the VHF tuner is not disturbed while tuning of the UHF tuner is being effected.

It is a primary object of the invention to overcome and solve the above indicated difficulties and problems. To these ends the invention provides a novel combination of driving members which cooperate to realize the above noted desirable features and to satisfy the above noted requirements.

Another and more specific object of the invention resides in the provision of an improved and simplified drive system readily capable of being drivingly associated with conventional tuning units without materially changing their basic construction and without modification in their established mode of operation. Thus the tuner driving system of the invention makes it possible to adapt a television receiver for the reception of all available TV channels without unduly adding to its production costs.

In accordance with the present invention, the above mentioned objectives as well as other features and advantages which will appear as the description progresses, are achieved by employing a set of three manually rotatable members arranged in concentric relation. The first or innermost member is connected to the VHF station selector and is operable to impart step-by-step movement thereto for effecting coarse VHF tuning. The second or outermost member is connected to the UHF station selector and is operable to impart rapid continuous movement thereto for effecting UHF coarse tuning. The third or intermediate member is associated with the VHF fine tuning preset mechanism and with the UHF station selector to effect accurate tuning to either a selected VHF station or a selected UHF station. In a preferred and specific embodiment, the VHF station selector is supplied with means for disabling the VHF fine tuning preset mechanism in response to switching from VHF to UHF operation, so that the selection of and tuning to a UHF station can be carried out without affecting established VHF fine tuning adjustments.

The invention, and its characteristic features and advantages, will be more fully understood from the following description taken in conjunction with the accompanying drawing, in which.

Figures 1, 2, 3, 4, 5:
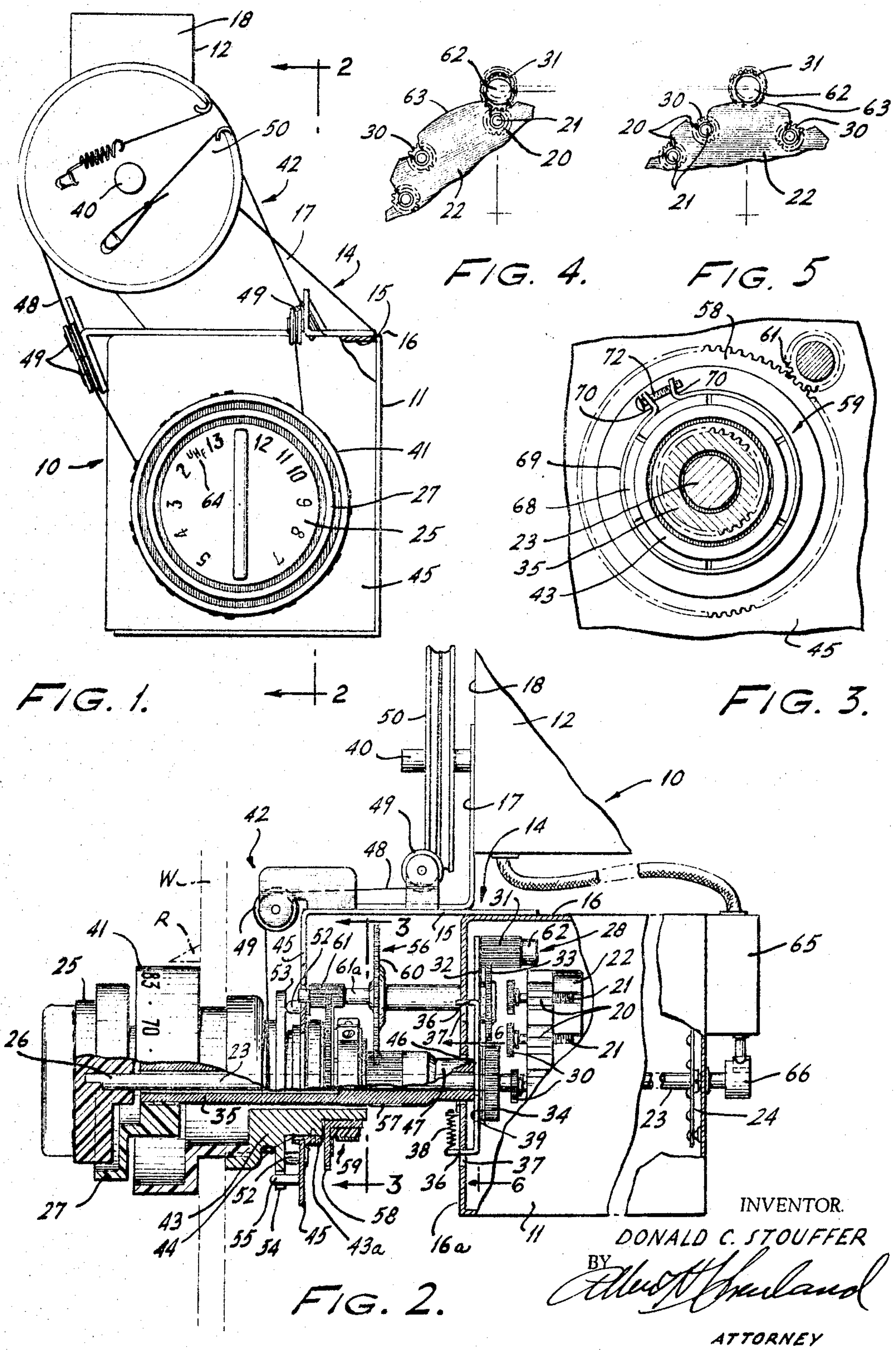
FIGURE 1 is a front elevational view of a VHF-UHF tuner arrangement provided with a drive system embodying the invention.
FIGURE 2 is an elevational-sectional view looking in the general direction of arrow 2—2 of FIGURE 1.
FIGURE 3 is an enlarged sectional view taken substantially on line 3—3 of FIGURE 2.
FIGURE 4 and 5 are explanatory views illustrating structure effective to control the operation of the VHF fine tuning preset mechanism.

With more particular reference to the drawings, there is shown in FIGURES 1 and 2 an assembly 10 including a VHF tuner 11 and a UHF tuner 12. These two tuners are affixed to each other by means of a rigid bracket structure 14 having a part 15 attached to the VHF tuner housing wall 16 and a part 17 attached to UHF tuner housing wall 18.

As hereinbefore indicated the VHF tuner is preferably of the conventional step-wise rotary switch variety in which pretuned circuit elements (not shown) serve to effect station channel selection through operation of rotary switches and in which variable inductance coils 20 serve to effect fine tuning to the selected station channels through operation of adjustable screw threaded slugs 21. These coils and slugs are arranged in a turret member 22 carried and rotatable step-by-step with a channel selector shaft 23 through successive tuning positions corrresponding to the twelve available VHF channels, namely channels 2 through 13. The tuning positions are determined by means of an indexing detent-carrying member 24 (FIGURE 2), associated with a selector shaft 23, and are visually indicated by means of channel designating characters which, as seen in FIGURE 1, can and preferably are provided on a manually operable knob 25 to cooperate with a suitable reference pointer or marker diagrammatically represented at R in FIGURE 2. This knob is affixed to a forwardly extended portion 26 of the selector shaft 23 to drive the latter and is normally disposed outside the receiver cabinet wall, represented at W (FIGURE 2), so as to readily be accessible for driving the selector shaft.

Fine tuning to a selected VHF station channel is accomplished by manipulation of a fine tuning knob 27 concentric with the station selector knob 25, and adapted to effect adjustment of the aforesaid screw threaded inductance-adjusting slugs 21 through function of a motion transmitting mechanism 28. This mechanism as seen in FIGURE 2, includes adjusting gears 30 affixed to inductance-adjusting slugs 21 and so disposed as to be successively brought, through step-by-step rotation of the selector shaft 23, in a position to be drivingly engaged by a pinion gear 31 located adjacent the periphery of turret member 22 and journalled on a mounting plate 32. The pinion gear 31 is meshed with an idler gear 33 also journalled on the plate 32 and arranged for meshing engagement with a master gear 34 carried by and rotatable with a tubular fine tuning shaft 35 arranged concentrically with respect to the selector shaft 23, and to which latter the fine tuning knob 27 is fixedly attached. The pinion gear 31 is normally displaced with respect to adjusting gear 30 so as not to interfere with the rotation of turret member 22 when driven by the station selector shaft 23. For that purpose and as seen in FIGURE 2, the plate 32 has lateral ears 36 received within slots 37 in the VHF tuner front wall 16*a*, and spring means 38 is associated with the plate to bias the same in such manner that idler gear 33 and pinion gear 31 are placed in inoperative position, that is to say into position where the idler gear disengages master gear 34 and where pinion gear 31 is spaced from adjusting gears 30. In order to bring the idler gear and the pinion gear into operative position, there is provided well known friction means 39 interposed between the plate 32 and the fine tuning shaft 35 so that upon rotation of the latter the plate is caused to slide for bringing the idler and pinion into operative engagement with the aforesaid master gear 34 and adjusting gears 30.

Figure 6:
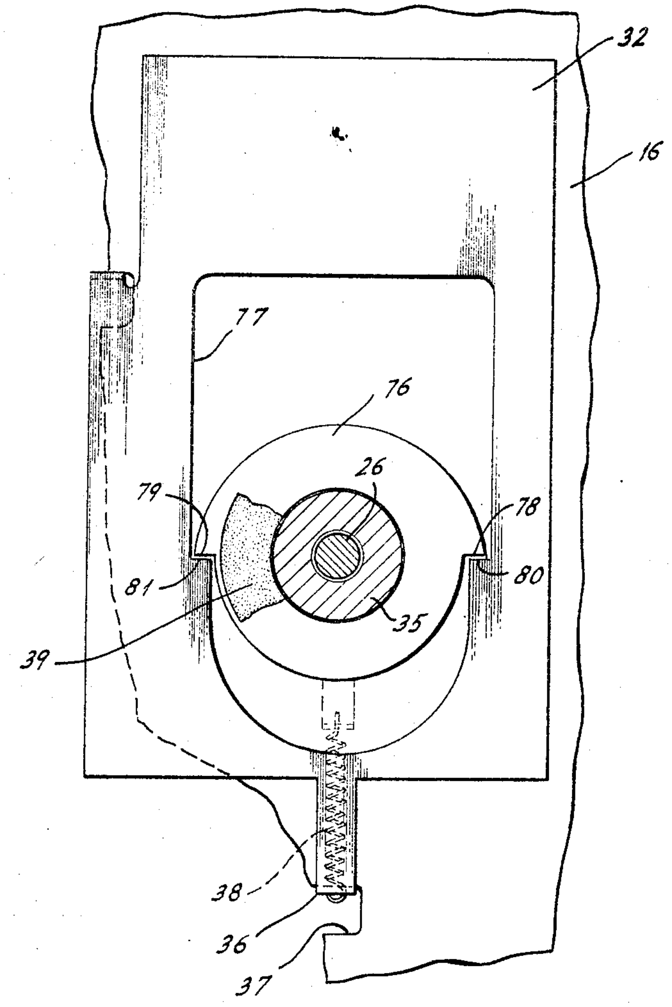
FIGURE 6 is a sectional elevation taken along the cutting plane 6—6 as seen in FIGURE 2.

Referring to FIGURE 6, plate 32 carrying the pinion and idler gears 31 and 33 respectively, is translated downward on rotation of fine tuning shaft 35 through the intermediation of friction means 39 carried on the inner face of master gear 34 acting on disc 76 rotatably journalled on collar 35. The disc 76 is disposed within a cutout 77 formed in plate 32 and is provided with shoulders 78 and 79 which on rotation of disc 76 in either a clockwise or counterclockwise direction engage one or the other of cooperating shoulder portions 80 and 81 formed in plate 32. On engagement of confronting shoulder portions plate 32 is translated downward against the resisting force of spring 38. When tab 36 of plate 32 bottoms in slot 37, continued rotation of shaft 35 through manipulation of knob 27 causes friction means 39 to slip permitting fine tuning of adjusting gears 30 through the gear train comprised of master gear 34, idler 33 and pinion 31.

Because of this construction described above, it will be understood that any one of screw threaded slugs 21 can be moved inwardly or outwardly of turret member 22 through rotation of pinion gear 31 thus adjusting the slug with respect to its associated inductance coil 20. In this manner each slug 21 can be adjusted into exact position to effect fine tuning to the station channel which it represents.

As hereinbefore noted, the UHF tuner 12 is of the continuously variable type provided with a rotatable tuning shaft 40. Rotation is imparted to the UHF tuner shaft 40 by means of a manually operable UHF tuner knob 41 and a cord-and-pulley arrangement 42. As seen in FIGURES 1 and 2, the UHF tuning knob 41 is disposed concentrically with respect to VHF station selector knob 25 and fine tuning knob 27, and forms part of a tubular sleeve 43 which is received upon and rotatable with respect to the aforesaid concentric shafts 23 and 35. The sleeve extends through and is rotatable in an opening 44 formed in a plate 45 which is an angular projection of bracket part 15. The sleeve 43 is retained on the plate 45 by means of a collar 43*a* keyed or otherwise affixed to the sleeve. The plate is spaced forwardly of the front wall 16*a* of the VHF tuning housing, which wall is provided with a bearing 46 through which a portion 47 of the fine tuning shaft 35 extends. Thus bearing 46 serves to suspend the assembled concentric shafts 23 and 35 and sleeve 43 for rotation through manipulation of their respective knobs 23, 27 and 41.

The cord 48 of the cord-and-pulley arrangement 42 runs over guide pulleys 49 and is wound about sleeve 43 and about a drive pulley 50 affixed to UHF tuning shaft 40. Thus when sleeve 43 is rotated in response to manual operation of UHF tuning knob 41, the cord-and-pulley arrangement functions to drive the shaft 40 for effecting coarse tuning of the UHF tuner 12. The sleeve 43 and its associated elements are stabilized during rotation by means of spaced abutments 52 fixed on extended bracket plate 45 to bear upon one face of an annular flange 53 carried by the sleeve, and rotation of the latter in either clockwise or counterclockwise direction is limited by means of interengageable stops 54 and 55 provided on flange 53 and plate 45, respectively. These stops are so related as to arrest rotation of the UHF tuning structure when reaching those positions corresponding to the high end and the low end of the UHF band. These two positions as well as the intermediate positions corresponding to the established UHF station channels, namely channels 14 to 83, can be and preferably are indicated on the manual knob 41 to cooperate with the reference pointer or marker R. It is important to note that, in accordance with the present invention, the stops 54 and 55 being located at the sleeve 45, rather than at the UHF tuner, act to effect positive arrest of the sleeve immediately upon reaching the end tuning positions and thus prevent the imposition of undue stress on the cord 48.

Fine tuning adjustment of the UHF tuner is accomplished through function of speed reduction means 56 associated with the fine tuning shaft 35. The reduction means is disposed within the space between the UHF tuner wall 16*a* and extended bracket plate 45, and includes a main gear 57, a gear wheel 58 affixed to a frictional clutch 59 and coaxial gear 60 and pinion 61 meshing respectively with the main gear 57 and the gear wheel 58. As illustrated in FIGURE 2, the main gear 57 is formed on the fine tuning shaft 35 and rotates therewith in response to manipulation of the tuning knob 27. The combined gear wheel and friction clutch assembly is mounted rotatably on the rotatable UHF tuning sleeve 43, the clutch being normally adapted for frictionally gripping the sleeve to effect rotation thereof through function of the main gear and coaxial gear 60 and pinion 61 which are affixed to a rotatable stub shaft 61*a*. Because of this construction it will be understood that manipulation of the fine tuning knob 27 will impart rotation to the fine tuning shaft 35 and thus actuate the reduction gear train and friction clutch assembly to rotate the sleeve 43 for driving the UHF tuning shaft, through the aforesaid cord and pulley arrangement 42, at reduced speed to obtain precise tuning of a selected station within the UHF channel band.

While fine tuning of the UHF tuner is being carried out, the VHF fine tuning mechanism is rendered inoperative so as to prevent a change in the setting of the VHF fine tuning adjustments and, more importantly, to restrict the motion of the plate 32 to minimize backlash effect on the fine tuning shaft, which effect would result in offsetting UHF fine tuning. For that purpose axle 62 of the pinion gear 31 is extended for engagement with a blank area 63 (see FIGURE 5) on the periphery of the turret member 22, which area corresponds to the UHF position represented at 64 on the selector knob 25 as seen in FIGURE 1. Because of this construction it will be appreciated that with the selector knob 25 adjusted to the UHF position, the plate 32 is arrested in its downwardly sliding motion when the fine tuning shaft 35 is operated to effect UHF fine tuning. Accordingly, when the tuning shaft 35 is released, the upward motion of the plate, under influence of spring 38, is so limited as not to displace the fine tuning shaft to an extent sufficient to disturb the UHF fine tuning.

Switching to and from VHF and UHF fine tuners is accomplished by means of a switch 65 operated by a switch actuator 66 carried by and movable with the VHF selector shaft 23. The switch 65 functions electrically to connect the UHF tuner in the receiver circuit only when the selector knob 25 is in the UHF position. With the selector knob in any other position, the UHF tuner is switched out, so that the fact that the UHF tuner is mechanically driven during VHF fine tuning is no problem since that tuner is electrically disconnected.

In particular accordance with the invention, the friction clutch 59 affixed to the gear wheel 58 is adapted to function so as to provide for rotation of said gear wheel when driven with the gear train in response to operation of the fine tuning shaft 35 in the manner hereinabove described. Moreover the clutch 59 is such that it provides slippage between the aforesaid gear wheel 58 and the rotatable sleeve 43 so as to prevent interference by the speed reduction means 56, when said sleeve 43 is operated to effect coarse tuning of the UHF tuner. For that purpose and as shown in FIGURE 3, the clutch incorporates a split collar 68 and a pressure band 69. The collar 68 surrounds the UHF tuning sleeve 43 and the band 69 embraces the collar to urge the same into frictional engagement with the sleeve. The band 69 is split and has means in the form of ears 70 and screw-threaded elements 72 serving to adjust the clutch for proper frictional engagement with the sleeve in order to obtain the above noted functions.

From the foregoing description it will be appreciated that the invention provides a simplified arrangement whereby associate VHF and UHF tuners can readily be operated to effect coarse and fine tuning to all channels in the two available television frequency bands. While a preferred embodiment of the invention has been shown and described, it will be understood that the invention is not necessarily limited to that embodiment but embraces such changes and modifications as come within the scope of the appended claims.

What I claim is:

1. A drive system for two associated tuners, one tuner having a rotatable VHF station selector and adjustable VHF fine tuning elements carried thereby, the other tuner having a rotatable UHF tuning shaft, said system comprising a first member connected to the VHF station selector and rotatable to drive the latter for placement in selectible operative positions including a UHF switching position, a second member drivingly connected to the UHF tuning shaft and rotatable to drive the latter for UHF coarse tuning, a third member mounted for rotation with respect to the first and second members, motion transmitting means between the third member and the VHF tuning elements to drive the latter for effecting VHF fine tuning, speed reduction means between the third member and the second member to rotate the latter and thereby drive the UHF tuning shaft for effecting UHF fine tuning, and means for disabling the motion transmitting means in response to placement of the VHF selector in the aforesaid UHF switching position.

2. A drive system as set forth in claim 1, in which the first, second, and third members are disposed concentrically with respect to each other.

3. A drive system as set forth in claim 1, in which the first, second, and third members are each provided with a knob for imparting independent manual rotation thereto.

4. A drive system as set forth in claim 1, in which the first, second, and third members are disposed concentrically with respect to each other, and in which knobs, one for each of said members, are arranged concentrically and affixed to their respective member, the knobs being separately operable to impart independent manual rotation to their respective members.

5. A drive system as set forth in claim 1, in which the motion transmitting means includes a driven element movable into driving engagement with the adjustable VHF fine tuning elements, and in which the means for disabling the motion transmitting means includes means provided on the VHF station selector for preventing said driven element from moving into engagement with the VHF fine tuning elements when the selector is placed in the UHF switching position.

6. A drive system as set forth in claim 1, in which the speed reduction means includes a combined gear wheel and friction clutch assembly mounted rotatably on the second rotatable member, said assembly being operative to drive said second rotatable member at reduced speed when said third rotatable member is rotated, the friction clutch providing for slippage between the third rotatable member and the second rotatable member when the latter is directly rotated.

7. A drive system for two associated tuners, one tuner having a rotatable VHF station selector and adjustable VHF fine tuning elements carried thereby, the other tuner having a rotatable UHF tuning shaft, said system comprising a first member connected to the VHF station selector and rotatable to drive the latter for placement in selectible operative positions including a UHF switching position, a second member drivingly connected to the UHF tuning shaft and rotatable to drive the latter for UHF coarse tuning, a third member mounted for rotation with respect to the first and second members, said first, second and third members being disposed concentrically with respect to each other, knobs one for each of said members, each knob being affixed to its respective member and being manually operable to impart manual rotation thereto, motion transmitting means including a driven element movable into driving engagement with the VHF tuning elements to drive the latter for effecting VHF fine tuning, speed reduction means between the third member and the second member to rotate the latter and thereby drive the UHF tuning shaft for effecting UHF fine tuning, said reduction means including a combined gear wheel and friction clutch assembly mounted rotatably on the second rotatable member, said assembly being operative to drive said second rotatable member at reduced speed when said third rotatable member is rotated, the friction clutch providing for slippage between the third rotatable member and the second rotatable member when the latter is directly rotated through manipulation of its knob, and means for disabling the motion transmitting means in response to placement of the VHF station selector in the aforesaid UHF setting position, said disabling means including means provided on the VHF station selector to engage the aforesaid driven element for preventing its movement into engagement with the VHF tuning element when the selector is in said switching position.

8. A drive system for two associated tuners, one tuner having a rotatable VHF station selector and adjustable VHF fine tuning elements carried thereby, the other tuner having a rotatable UHF tuning shaft, said system comprising three rotatable members arranged concentrically with respect to each other, the innermost member being connected directly to the VHF station selector to drive the same for effecting the selection of a VHF station and including a UHF switching position, first motion transmitting means connected to the outermost member and to the UHF tuning shaft to impart rotational motion from the outermost member to said shaft for effecting UHF coarse tuning, second motion transmitting means engageable with the intermediate member and with the VHF tuning elements to drive the latter for effecting VHF fine tuning, third motion transmitting means between the intermediate member and the outermost member for driving the latter at reduced speed and thereby effecting UHF fine tuning, and means provided on the VHF station selector and the second motion transmitting means to prevent the latter from engagement with the VHF tuning elements when said selector is placed in the aforesaid UHF position.

9. A driving system as set forth in claim 8, in which the mentioned first motion transmitting means is in the form of a belt and pulley drive.

10. A driving system as set forth in claim 8, in which the mentioned second motion transmitting means includes a gear affixed to the innermost member and a pinion adapted to be driven by said gear, said pinion being movable into driving engagement with the VHF fine tuning elements to drive the same for their VHF fine tuning adjustments when the VHF station selector is out of the UHF position.

11. A driving system as set forth in claim 8, in which the outermost member is provided with a sleeve and the mentioned third motion transmitting means includes a combined gear wheel and friction clutch assembly mounted rotatably on said sleeve, said assembly being operative to drive said outermost member at reduced speed when the intermediate member is rotated, the friction clutch providing slippage between the intermediate member and the outermost member when the latter is directly rotated.

12. A driving system as set forth in claim 8, in which the outermost member is provided with a sleeve and the mentioned third motion transmitting means includes a combined gear wheel and friction clutch assembly mounted rotatably on said sleeve, said assembly being operative to drive said outermost member at reduced speed when the intermediate member is rotated, the friction clutch providing slippage between the intermediate member and the outermost member when the latter is directly rotated, said clutch including a split collar surrounding the aforesaid sleeve and an adjustable pressure band embracing said collar to adjust its frictional engagement with the sleeve.

13. A driving system as set forth in claim 8, in which the mentioned second motion transmitting means includes a gear affixed to the innermost member and a pinion adapted to be driven by said gear, said pinion being movable into driving engagement with the VHF fine tuning elements for their VHF fine tuning adjustment when the VHF station selector is out of UHF position, and in which the outermost member is provided with a sleeve and the mentioned third motion transmitting means includes a combined gear wheel and friction clutch assembly mounted rotatably on said sleeve, said clutch including a split collar surrounding the aforesaid sleeve and an adjustable pressure band embracing said collar to adjust its frictional engagement with the sleeve.

14. A drive system for two associated tuners, one tuner having a rotatable VHF station selector and adjustable VHF fine tuning elements carried thereby, the other tuner having a rotatable UHF tuning shaft, said system comprising three rotatable members arranged concentrically with respect to each other, the innermost member being connected directly to the VHF station selector to drive the same for effecting the selection of a VHF station and including a UHF switching position, a cord and pulley arrangement between the outermost member and the UHF tuning shaft to transmit rotational motion from said outermost member to said shaft for effecting UHF coarse tuning, a gear affixed to the innermost member, a pinion adapted to be driven by said gear, said pinion being movable into driving engagement with the VHF fine tuning elements to drive the same for their VHF fine tuning adjustments when the VHF station selector is out of UHF position, a combined gear train and friction clutch assembly connected with the intermediate member and the outermost member for driving the latter at reduced speed to effect UHF fine tuning in response to rotation of the intermediate member, the friction clutch providing slippage between the intermediate member and the outermost member and including a slip collar surrounding part of the aforesaid outermost member and an adjustable pressure band embracing said collar to adjust its frictional engagement with said outermost member part, and means provided on the VHF station selector and engageable with the aforesaid pinion to prevent its engagement with the VHF tuning elements when said selector is placed in the aforesaid UHF position.

References Cited by the Examiner

UNITED STATES PATENTS

| | | | |
|---|---|---|---|
| 2,756,599 | 7/1956 | Sperber | 74—10.5 |
| 2,761,321 | 9/1956 | Bieze | 74—10.5 |

MILTON KAUFMAN, *Primary Examiner.*